TEMPERATURE STABLE LOW FREQUENCY FILTER WITHOUT INDUCTANCE

Filed Dec. 16, 1963

INVENTOR.
RICHARD W. CARROLL
BY
ATTORNEY

United States Patent Office 3,303,354
Patented Feb. 7, 1967

3,303,354
TEMPERATURE STABLE LOW FREQUENCY FILTER WITHOUT INDUCTANCE

Richard Walter Carroll, Marion, Iowa, assignor to Collins Radio Company, Cedar Rapids, Iowa, a corporation of Iowa Filed Dec. 16, 1963, Ser. No. 330,802
7 Claims. (Cl. 307—88.5)

As electronic equipment has become more and more compact, it has been desirable to develop thin film techniques for obtaining very small electrical components. Capacitors and resistors are quite easy to fabricate in microfilm. However, at frequencies below 500,000 cycles, inductances have not been feasible and this has been a major obstacle in the development of thin film microcircuit techniques. To abrogate this problem, circuits have been developed which utilize only resistors, capacitors and transistors to duplicate the behavior of certain inductor and capacitor networks. Thus, inductances are not replaced but the need for them is simply eliminated.

It is an object of this invention, therefore, to provide an RC network capable of functioning as a filter without the requirement for an inductor.

Another feature of this invention is to provide for a temperature compensated active RC network which is stable under a wide frequency range.

A feature in this invention is found in the provision for a pair of RC filters connected to the input and output of a negative impedance converter wherein said negative impedance converter comprises a plurality of transistors, interconnected such that temperature changes do not vary the effective bandpass of the composite filter circuit.

Further objects, features and advantages of the invention will become apparent from the following description and claims when read in view of the drawings, in which:

Figure 1:
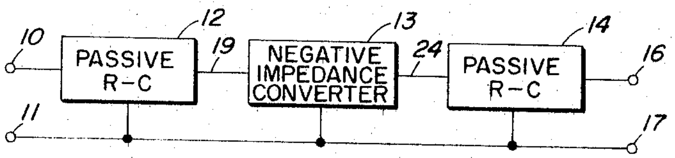
FIGURE 1 is a block diagram of a negative impedance active RC filter.

One of the schemes of active RC network synthesis utilizes a negative impedance converter in conjunction with two RC networks as shown in FIGURE 1.

A pair of input terminals 10 and 11 are connected to a passive RC network 12 which supplies an output to a negative impedance converter 13. The output of the negative impedance converter 13 is connected to a second passive RC network 14 which is connected across output terminals 16 and 17. Such a structure is capable of producing a wide variety of transfer functions which are usually associated only with networks containing inductances. For a more detailed description of such devices, reference may be made to the article in the Proceedings of the IRE, volume 42, pages 555–564, entitled, "RC Active Filters," written by J. G. Linvill, which was published in March 1954.

Figure 2:
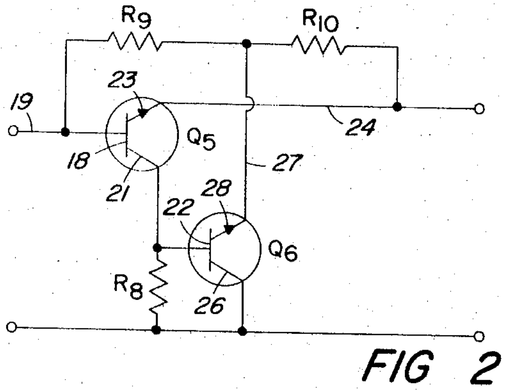
FIG 2 PRIOR ART
FIGURE 2 is a schematic diagram of negative impedance converters used in prior devices.

A conventional negative impedance converter that could be used for block 13 in FIGURE 1 is shown in FIGURE 2, wherein a pair of transistors $Q_5$ and $Q_6$ are connected with the base 18 of transistor $Q_5$ connected to the input lead 19. The collector 21 of transistor $Q_5$ is connected to the base 22 of transistor $Q_6$, the emitter 23 of transistor $Q_5$ is connected to output line 24. A dropping resistor $R_8$ is connected between the base 22 and the collector 26 of transistor $Q_6$ to properly bias the transistor $Q_6$. A pair of resistors $R_9$ and $R_{10}$ are connected between leads 19 and 24 and their junction point is connected by lead 27 to the emitter 28 of the transistor $Q_6$.

However, a negative impedance circuit such as shown in FIGURE 2 has very poor temperature stability and is therefore unusable except under laboratory conditions. One of the reasons for this is that as temperature varies, the gain through transistors $Q_5$ and $Q_6$ becomes very small due to the current through the resistor $R_8$ and such arrangements have not been successful when applied to microminiaturization with thin film techniques.

Figure 3:
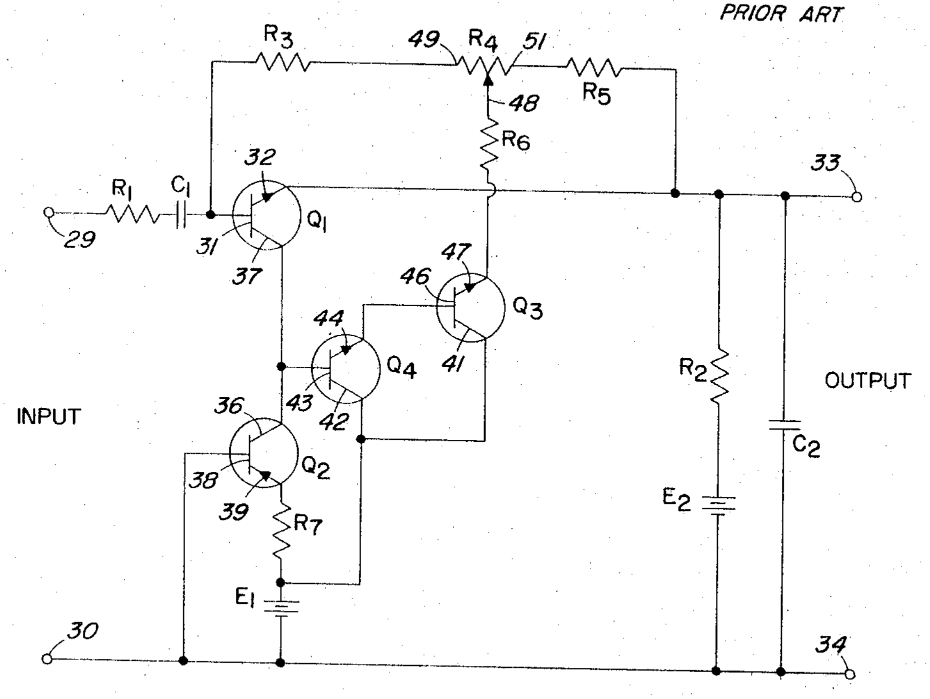
FIGURE 3 is a schematic of the present invention.

The present invention is illustrated in FIGURE 3 and is capable of temperature stability over a broad frequency range.

An input terminal 29 is connected to a resistor $R_1$. $R_1$ is connected in series with a condenser $C_1$. The base 31 of a transistor $Q_1$ is connected to the condenser $C_1$. The emitter 32 of transistor $Q_1$ is connected to output terminal 33. An input terminal 30 is connected to output terminal 34. A second transistor $Q_2$ has its collector 36 connected to collector 37 of transistor $Q_1$. Base 38 of transistor $Q_2$ is connected to the input terminal 30. A biasing voltage $E_1$ is connected to the input terminal 30, and through a resistor $R_7$ to the emitter 39 of transistor $Q_2$. Biasing voltage $E_1$ is also connected to collectors 41 and 42 of transistors $Q_4$ and $Q_3$. The base 43 of transistor $Q_4$ is connected to the collectors 36 and 37 of transistors $Q_1$ and $Q_2$. The emitter 44 of transistor $Q_4$ is connected to the base 46 of transistor $Q_3$. The emitter 47 of transistor $Q_3$ is connected to resistor $R_6$ which has its opposite side connected to a variable contact 48 which engages a resistor $R_4$. One end 49 of resistor $R_4$ is connected to a resistor $R_3$ which has its opposite side connected to the base 31 of transistor $Q_1$. The other end 51 of resistor $R_4$ is connected to output terminal 33 through resistor $R_5$. A resistor $R_2$ is connected to output terminal 33 and in series with a biasing voltage $E_2$ to output terminal 34. A condenser $C_2$ is also connected across the output terminals 33 and 34.

In a particular circuit constructed according to the schematic of FIGURE 3, the resistors, condensers and biasing voltages had the following values:

| | | |
|---|---|---|
| $R_1$ | ohms | 16.65K |
| $R_2$ | do | 31.7K |
| $R_3$ | do | 1.96K |
| $R_4$ | do | 500 |
| $R_5$ | do | 1.96K |
| $R_6$ | do | 8.2K |
| $R_7$ | do | 3.48K |
| $E_1$ | volts | 1.5 |
| $E_2$ | do | 28 |
| $C_1$ | microfarads | 0.0433 |
| $C_2$ | do | 0.021 |
| $Q_1$ | | Type 2N333 |
| $Q_2$ | | Type 2N328A |
| $Q_3$ | | Type 2N338 |
| $Q_4$ | | Type 2N338 |

A filter with these components has a center frequency of 320 cycles per second.

The significant features of the circuit are:

(1) $Q_2$ serves two important purposes—

(a) It accurately determines the quiescent direct current through $Q_1$ and makes this current quite indpendent of temperature.

(b) It presents a very large dynamic impedance to the collector of $Q_1$ so that very little signal current is diverted to ground at this point, but is fed to the base of $Q_4$ where it belongs. This action is fundamental to the A.-C. temperature stability of the circuit, since it maintains the current gain from the collector of $Q_1$ to the emitter of $Q_3$ at a very high level. If this A.-C. current gain can be kept high, its variations with temperature becomes insignificant because of the fact that under this condition, the conversion factor of the negative impedance converter is made to depend only upon $R_3$, $R_4$, and $R_5$.

(2) $Q_1$ performs its normal function of providing a current sensitive short circuit from input to output, but in addition to this, it accurately determines quiescent current in $Q_3$ and $Q_4$. This is true because the base-emitter voltage of $Q_1$ is applied across $R_3$, $R_4$, and $R_5$, the voltage across $R_4$ is tapped by $R_6$ thus fixing the current flowing through the combined resistance of $R_2$, $R_4$, $R_5$, and $R_6$. This current is primarily the collector current for $Q_3$ and $Q_4$ when these transistors are conducting. (Base current for $Q_1$ must also flow through this path but this will be smaller than the collector currents from $Q_3$ and $Q_4$ by more than an order of magnitude.)

(3) $R_6$ develops a D.-C. voltage drop which combined with the voltage drops on $R_5$ and part of $R_4$ fixes the collector to emitter voltage on $Q_1$. Now the total current flowing through $R_2$ is solidly fixed. Therefore, since $V_{CE}$ (voltage from collector to emitter) for $Q_1$ is fixed, $V_{CE}$ for $Q_2$ is fixed as is $V_{CE}$ for $Q_3$ and $Q_4$.

It should be noted that these bias quantities will change very little with temperature. $Q_3$ and $Q_4$ are connected in the Darlington configuration to give a very high gain ($\beta$). The potentiometer $R_4$ serves as an adjustment of the ratio between the arms of the resistance bridge, $R_3$, $R_4$ and $R_5$. This allows a precise, temperature independent adjustment of filter bandwith. The elements $R_1$, $C_1$, $R_2$ and $C_2$ are the basic frequency determining elements.

The most important novelty involved in this circuit is the simple and effective biasing arrangement which provides a temperature stability previously unattainable by simple means. It also makes performance very independent of normal variations in transistors.

By varying contact 48 along resistor $R_4$ the bandwidth of the filter can be adjusted and Q can be obtained from very low to as high as 50 or 60. The center frequency of the filter may be varied according to the equation $$fo=\frac{1}{2\pi\sqrt{R_1R_2C_1C_2}}$$

Thus, it is seen that a filter network using only resistors and capacitors has been described which may be constructed by microfilm techniques using resistors, capacitors and transistors.

Although this invention has been described with respect to a particular embodiment thereof, it is not to be so limited, as changes and modifications may be made therein which are within the spirit and scope of the invention as defined by the appended claims.

I claim:

1. A filter network for use with a two line system comprising: a first and a second passive resistive capacitive filter, a negative impedance converter connected between said first and second resistive capacitive filters, said negative impedance converter comprising a first amplifier means connected in one of said lines; a second amplifier means connected between the other of said lines and said first amplifier means at a junction point, and a third amplifier means connected between said junction point and said other line.

2. The network of claim 1 where said first passive resistive capacitive filter comprises: first resistive means and first capacitive means connected in series in said one line, and said second passive resistive capacitive filter comprises a parallel combination of second resistance means and second capacitive means connected between said two lines.

3. A filter network for use with a two line system comprising: a first and a second passive resistive capacitive filter, said first filter including first resistive means and first capacitive means connected in series in one of said lines, said second filter including a parallel combination of second resistive means and second capacitive means connected between said two lines, a negative impedance converter connected between said first and second resistive capacitive filters, said negative impedance converter comprising a series resistive branch in parallel with said one line, a first amplifier means including a first transistor connected with its base and emitter in said one line, a second amplifier means including a second transistor which has its base and emitter connected to said other line and its collector connected to the collector of said first transistor and a third amplifier means connected between said junction point and said series resistive branch.

4. The filter of claim 3 wherein said third amplifier means comprises a third transistor having its base-collector circuit connected between said junction of said first and second transistors and said other line, and a fourth transistor connected between said third transistor and said series resistive branch.

5. A negative impedance converter for use with a two line system comprising: a first transistor having its base and emitter connected in series with one of said lines, a second transistor with its base and emitter coupled to the other of said lines, the collectors of the first and second transistors connected together, a series resistive path connected across the base and emitter of said first transistor, and an amplifying means connected between the connected collectors of said first and second transistors and said resistive path.

6. A negative impedance circuit for use with a two line system comprising: a first transistor connected with its base and emitter in series with one of said lines, a second transistor with its base connected to the other of said lines and its collector connected to the collector of the first transistor, a biasing voltage and a first resistance connected in series between the other of said lines and the emitter of the second transistor, a third and a fourth transistor with their collectors connected to said biasing voltage, the base of said third transistor connected to the collectors of the first and second transistors, the emitter of said third transistor connected to the base of said fourth transistor, a series resistive path connected across the base and emitter of said first transistor, and the emitter of said fourth transistor coupled to said resistive path.

7. A negative impedance circuit for use in a two line system comprising: a first transistor connected with its base and emitter in series with one of said lines, a second transistor with its base connected to the other of said lines and its collector connected to the collector of said first transistor, a biasing voltage and a first resistance connected in series between the other of said lines and the emitter of said second transistor, third and fourth transistors with their collectors connected to said biasing voltage, the base of said third transistor connected to the collectors of said first and second transistors, the emitter of said third transistor connected to the base of said fourth transistor, a series resistive path including an adjustable resistance means connected across the base and emitter of said first transistor, and a third resistor connected between the emitter of said fourth transistor and said adjustable resistance means.

References Cited by the Examiner

UNITED STATES PATENTS 3,204,048 8/1965 De Monte ---------- 333—80 X

ARTHUR GAUSS, *Primary Examiner.*

J. ZAZWORSKY, *Assistant Examiner.*